US012612703B2

(12) United States Patent　(10) Patent No.: US 12,612,703 B2
Poodt et al.　(45) Date of Patent: Apr. 28, 2026

(54) METHOD FOR PROVIDING A SUBSTRATE FOR AN ELECTROCHEMICAL CELL WITH A CATALYTIC MATERIAL

(71) Applicant: Nederlandse Organisatie voor toegepast-natuurwetenschappelijk onderzoek TNO, s-Gravenhage (NL)

(72) Inventors: Paulus Willibrordus George Poodt, Deest (NL); Joan Elisabeth Balder, Ravenstein (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 474 days.

(21) Appl. No.: 18/004,944

(22) PCT Filed: Jul. 12, 2021

(86) PCT No.: PCT/NL2021/050438
　§ 371 (c)(1),
　(2) Date: Jan. 10, 2023

(87) PCT Pub. No.: WO2022/015161
　PCT Pub. Date: Jan. 20, 2022

(65) Prior Publication Data
　US 2023/0243050 A1　Aug. 3, 2023

(30) Foreign Application Priority Data
　Jul. 13, 2020　(EP) ..................................... 20185559

(51) Int. Cl.
　*C25B 11/00*　(2021.01)
　*C23C 16/40*　(2006.01)
　(Continued)

(52) U.S. Cl.
　CPC .......... *C25B 11/052* (2021.01); *C23C 16/405* (2013.01); *C23C 16/45527* (2013.01);
　(Continued)

(58) Field of Classification Search
　CPC ... C25B 11/052; C25B 11/067; C25B 11/054; C25B 9/23; C25B 11/075; C25B 1/04;
　(Continued)

(56) References Cited

U.S. PATENT DOCUMENTS 9,153,822　B2　10/2015　Shirvanian
2006/0188774　A1　8/2006　Niu et al.
　(Continued)

FOREIGN PATENT DOCUMENTS

CN　105406087　A　3/2016
CN　108165938　A　6/2018
　(Continued)

OTHER PUBLICATIONS

Park et al. "Ultra-low loading of IrO 2 with an inverse-opal structure in a polymer-exchange membrane water electrolysis". Nano Energy 58, 158-166 (2019).
　(Continued)

*Primary Examiner* — Zulmariam Mendez
(74) *Attorney, Agent, or Firm* — Banner & Witcoff, Ltd.

(57) ABSTRACT

Title: Method for providing a substrate for an electrochemical cell with a catalytic material Abstract The invention relates to a method for providing a substrate for an electrochemical cell with a catalytic material. The method comprises atomic layer deposition (ALD) that comprises providing a catalyst precursor for the catalytic material. The ALD further comprises providing a carrier precursor for forming a carrier material. The invention further relates to a
　(Continued)

substrate provided with a catalytic material and a PEM electrolysis cell comprising a substrate provided with a catalytic material.

16 Claims, 2 Drawing Sheets

(51) Int. Cl.

| | |
|---|---|
| *C23C 16/455* | (2006.01) |
| *C25B 1/04* | (2021.01) |
| *C25B 9/23* | (2021.01) |
| *C25B 11/052* | (2021.01) |
| *C25B 11/054* | (2021.01) |
| *C25B 11/067* | (2021.01) |
| *C25B 11/075* | (2021.01) |

(52) U.S. Cl.
CPC .. *C23C 16/45553* (2013.01); *C23C 16/45555* (2013.01); *C25B 1/04* (2013.01); *C25B 9/23* (2021.01); *C25B 11/054* (2021.01); *C25B 11/067* (2021.01); *C25B 11/075* (2021.01)

(58) Field of Classification Search
CPC ............ C23C 16/405; C23C 16/45527; C23C 16/45553; C23C 16/45555
See application file for complete search history.

(56) References Cited

U.S. PATENT DOCUMENTS

| | | | |
|---|---|---|---|
| 2010/0252441 A1 | 10/2010 | Chidsey et al. | |
| 2011/0139610 A1 | 6/2011 | Shirvanian | |
| 2012/0100301 A1 | 4/2012 | Kongkanand et al. | |
| 2014/0011119 A1 | 1/2014 | Lee | |
| 2015/0064606 A1 | 3/2015 | Dekempeneer et al. | |
| 2015/0086902 A1 | 3/2015 | Hards et al. | |
| 2015/0132683 A1 | 5/2015 | Shirvanian | |
| 2015/0207153 A1 | 7/2015 | Harkness et al. | |
| 2016/0177460 A1 | 6/2016 | Sato et al. | |
| 2017/0125821 A1 | 5/2017 | Sharman et al. | |
| 2017/0173564 A1* | 6/2017 | Ovesen | B01J 37/0201 |
| 2017/0183788 A1 | 6/2017 | Iida et al. | |
| 2018/0006315 A1 | 1/2018 | Pierpont et al. | |
| 2019/0071784 A1 | 3/2019 | Yoshinaga et al. | |
| 2019/0109330 A1 | 4/2019 | Shirvanian et al. | |
| 2019/0161868 A1 | 5/2019 | Jang et al. | |
| 2019/0264325 A1 | 8/2019 | Prinz et al. | |
| 2019/0379057 A1 | 12/2019 | Song et al. | |
| 2020/0127300 A1 | 4/2020 | Prinz et al. | |
| 2020/0385879 A1 | 12/2020 | Haug et al. | |
| 2024/0344216 A1 | 10/2024 | Shirvanian | |

FOREIGN PATENT DOCUMENTS

| | | | |
|---|---|---|---|
| CN | 108677209 A | 10/2018 | |
| CN | 110438525 A | 11/2019 | |
| DE | 102018105115 A1 | 9/2019 | |
| EP | 2159304 A1 | 3/2010 | |
| EP | 3159433 A1 | 4/2017 | |
| EP | 3940116 A1 | 1/2022 | |
| JP | 2005256058 A | 9/2005 | |
| JP | 2013199697 A | 10/2013 | |
| JP | 2014101578 A | 6/2014 | |
| JP | 2015520294 A | 7/2015 | |
| JP | 2017098231 A | 6/2017 | |
| JP | 2017115232 A | 6/2017 | |
| JP | 2018156798 A | 10/2018 | |
| JP | 2019049043 A | 3/2019 | |
| JP | 2019529702 A | 10/2019 | |
| JP | 2020094282 A | 6/2020 | |
| JP | 2021507998 A | 2/2021 | |
| KR | 101230527 B1 | 2/2013 | |
| WO | 2016191057 A1 | 12/2016 | |
| WO | 2019158960 A1 | 8/2019 | |
| WO | 2020185608 A1 | 9/2020 | |

OTHER PUBLICATIONS

Carmo et al. "A comprehensive review on PEM water electrolysis" Int. J. Hydrogen Energy 38, 4901-4934 (2013).

Azpitarte et al. Vapor phase infiltration: from a bioinspired process to technologic application, a prospective review. MRS Commun. 8, 727-741 (2018).

Destefano et al. Elucidation of Titanium Dioxide Nucleation and Growth on a Polydopamine-Modified Nanoporous Polyvinylidene Fluoride Substrate via Low-Temperature Atomic Layer Deposition. ACS Omega 3, 9, 10493-10502 (2018).

Shirvanian et al. Novel components in Proton Exchange Membrane (PEM) Water Electrolyzers (PEMWE): Status, challenges and future needs, A mini review, Electrochemistry Communications 114, 2020, 106704.

Lewinski et al, NSTF Advances for PEM Electrolysis—the Effect of Alloying on Activity of NSTF Electrolyzer Catalysts and Performance of NSTF Based PEM Electrolyzers. ECS Transactions, 69 (17) 893-917 (2015), 10.1149/06917.0893ecst.

Buhler et al. Optimization of anodic porous transport electrodes for proton exchange membrane water electrolyzers. J. Mater. Chem. A, 2019, 7, 26984-26995.

Yasutake, et al. Catalyst-Integrated Gas Diffusion Electrodes for Polymer Electrolyte Membrane Water Electrolysis: Porous Titanium Sheets with Nanostructured TiO2 Surfaces Decorated with Ir Electrocatalysts. J. Electrochem. Soc. 167 124523.

O'Neill et al; Catalyst Design with Atomic Layer Deposition. ACS Catalysis, Mar. 6, 2015 American Chemical Society, US—ISSN 2155-5435, vol. 5, Nr:3, pp. 1804-1825.

Buhler et al. From Catalyst Coated Membranes to Porous Transport Electrode Based Configurations in PEM Water Electrolyzers. Journal of the Electrochemical Society, 166 (14) F1070-F1078 (2019).

Eun, J. et al. Ultra-low loading of IrO2 with an inverse-opal structure in a polymer-exchange membrane water electrolysis. Nano Energy 58, 158-166 (2019).

* cited by examiner

Pristine porous substrate

ALD of
carrier
precursor carrier nanoparticles form in
the porous substrate

1) Optional pre-treatment step
2) ALD of catalyst precursor

In-situ core-shell nanoparticles
formed in the porous substrate

METHOD FOR PROVIDING A SUBSTRATE FOR AN ELECTROCHEMICAL CELL WITH A CATALYTIC MATERIAL

RELATED APPLICATIONS

This application is a National Stage Application under 35 U.S.C. 371 of co-pending PCT application PCT/NL2021/050438 designating the United States and filed Jul. 12, 2021; which claims the benefit of EP application Ser. No. 20/185, 559.0 and filed Jul. 13, 2020, each of which are hereby incorporated by reference in their entireties.

The invention is in the field of electrochemical cells. The invention is in particular directed to a method for providing a substrate for an electrochemical cell with a catalytic material, to the substrate and to electrolysis cells comprising the substrate.

Electrochemical cells are encountered in everyday life as for instance disposable AA batteries or lithium-ion batteries for mobile phones. Electrochemical cells are devices that can generate electrical energy from chemical reactions (e.g. galvanic cells) or may use electrical energy to cause chemical reactions (e.g. electrolytic cells).

Electrolytic cells typically drive non-spontaneous redox reactions when electrical energy is provided. They are often used to decompose chemical compounds through electrolysis. The cells typically comprise two electrodes (i.e. a cathode and an anode) that are separated by an electrolyte (and/or membrane). Catalysts may be used to promote electrolysis on the cathode and/or anode site.

A type of electrolytic cells are the proton-exchange membrane (also referred to as polymer-exchange membrane) (PEM) electrolysis cells wherein the electrolyte is often a solid polymeric membrane. PEM electrolysis cells are mainly used for water electrolysis. The membrane is typically electronically insulating but proton conducting. Generally, the protons are produced at the anode and travel through the membrane to the cathode to combine with electrons to form hydrogen. The reaction at the cathode site is typically catalyzed by a catalyst such as platinum. Within PEM electrolysis cells the rate determining step is usually the reaction occurring at the anode, which reaction is catalyzed by a catalyst such as iridium oxide ($IrO_2$). The anode may also be referred to as a porous transport layer (PTL), which is typically a conductive porous material.

Electrochemical cells may also include fuel cells, which are devices that typically convert chemical potential energy into electrical energy. A fuel such as hydrogen or an alcohol may be supplied to the anode and the oxidant such as oxygen or air to the cathode. The electrochemical reaction usually occurs at the electrodes where the chemical energy of the fuel and oxidant is converted into electrical energy and heat. Catalysts may be used to promote the oxidation of the fuel at the anode and the reduction of the oxidant at the cathode. A type of fuel cells may be a PEM fuel cell. Herein, typically the same principles apply as for a PEM electrolysis cell, albeit that the reverse reactions occur and role of the electrodes as the anode and cathode are switched.

A conventional method to introduce the catalyst in the PEM electrochemical cell is to mix the catalyst with the membrane material such as an ionomer comprising material, and to cast the resulting mixture (i.e. generally a slurry) on the pristine membrane. Typically, a layer in the order of 5 to 20 μm is created. However, the activity of the catalyst may not be optimally used as there is limited contact between the catalyst with the membrane and the electrode. Therefore, this approach requires a large amount of catalyst.

Alternatively, core-shell catalysts may be synthesized. The core can be a cheap non-catalytic material to reduce costs. Such constructions have been disclosed in e.g. US 2012/135862 for a platinum catalyst. The method to form such core-shell catalysts comprises the preparation of a core by the reaction of a support and metal precursors and selectively forming shell layers on the core by reacting the core support and metal precursors in the presence of an ester-based reducing agent. A drawback is the need for liquid phase synthesis.

An alternative to lower the loading of the catalyst are inverse opal structures (see for instance Park et al. *Nano Energy*, 58, 2019). The catalyst is typically formed by electrodeposition on a self-assembled layer of e.g. polystyrene. After the electrodeposition, the self-assembled layer may be removed and a porous layer of the catalyst is pressed on the membrane layer. However, this process typically requires a plurality of steps and may be time consuming.

It is an object of the present inventors to provide an improved method for providing a substrate (e.g. a membrane or an electrode) for an electrochemical cell with a catalytic material that at least partially overcomes the above-mentioned drawbacks. The inventors have surprisingly found that this object can be addressed with a method for providing a substrate for an electrochemical cell with a catalytic material wherein the method comprises atomic layer deposition (ALD).

Figure 1:
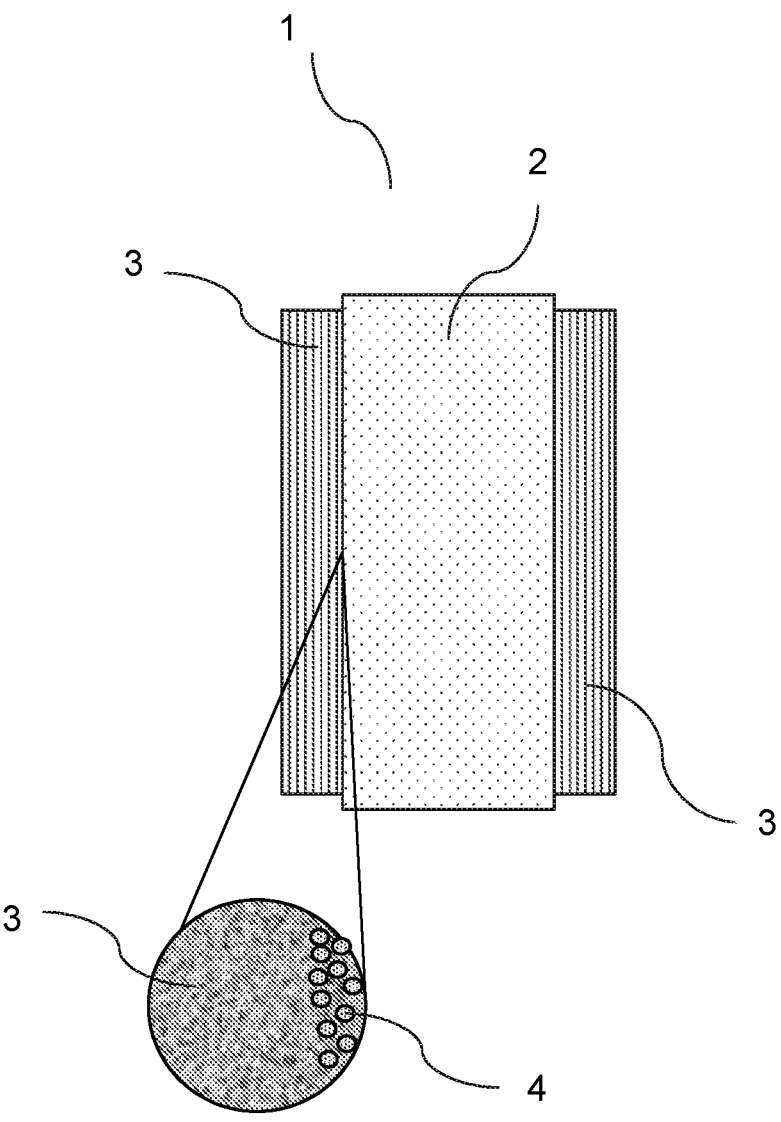
FIG. 1 illustrates an electrochemical cell wherein the substrate is provided with catalytic material according to the present invention.

Thus, in a first aspect the invention is directed to a method for providing a substrate for an electrochemical cell with a catalytic material, said method comprising atomic layer deposition (ALD). The substrate may be porous or non-porous. If the substrate is a membrane, it is typically a non-porous membrane. If the substrate is an electrode, it is typically a porous electrode.

ALD is a method for depositing thin-films and widely used in, for instance, the semi-conductor industry. Disclosures on using ALD to provide a catalytic material on a surface suitable for use in an electrochemical device are also known see i.a. WO2019/158960, US2015/086902, US2014/011119, US2012/100301, US2019/379057 and US2010/252441. ALD typically uses precursors and counter reactants that once reacted with each other form the desired material on a substrate. The substrate is often placed at a specific distance from the source of the reactants. Reactants is used herein to indicate both the precursors and the counter reactants, if present. Generally, the reactants are provided in a gaseous state and physically kept separate. In a first ALD cycle, a precursor is provided and placed on a surface such that this adheres and reacts with the surface to stay attached. The composition of the reactants after vaporization, adhesion and/or reaction may be slightly altered. The reaction of the precursor and the substrate is typically self-limiting meaning that even with an excess of precursor, no more than a single layer is typically deposited on the substrate. After the termination of the reaction the remaining precursor may be flushed away in a purging step (e.g. by applying vacuum or flushing with an inert gas). The purging step may moreover flush away material that is only adhered (i.e. not reacted) to the surface. The second reactant, a precursor or counter reactant, may then be provided and may react with the deposit (i.e. the already placed material). The reaction between the reactants is typically self-limiting as well. In the case that more than two different reactants are used, this process may be repeated until all reactants have been provided (i.a. purging and providing a subsequent reactant). One cycle thus generally relates to the sequential provision of all reactants and thus one cycle typically provides one monolayer of the final product. Multiple cycles may be performed to e.g. obtain a plurality of monolayers. The deposit may thus comprise one or more monolayers. The deposit may also take the form of a particles, e.g. a nanoparticle, after several cycles.

The catalytic material may be obtained by the reaction of the catalyst precursor with a first counter reactant. It may be possible that more than one cycle of providing the catalyst precursor and/or counter reactant is required. Accordingly, typically the ALD comprises providing a catalyst precursor for a catalytic material followed by providing a first counter reactant and allowing said first counter reactant to react with said catalyst precursor forming said catalytic material.

In a preferred embodiment, the catalytic material is deposited on the substrate in combination with a carrier material (albeit the deposition is carried out separately and not simultaneously). The carrier material may for instance enable less catalytic material to be required, while maintaining the same reactivity, as described in more detail herein-below. Accordingly, the ALD preferably further comprises providing a carrier precursor and allowing the carrier precursor to react with the substrate for the electrochemical cell followed by providing a second counter reactant that is allowed to react with the carrier precursor forming the carrier material. This second counter reactant may independently be chosen to be the same or different from the first counter reactant that is used for the catalytic material. This can then be followed by providing the catalyst precursor.

The carrier material can be used as a support for the catalytic material, thereby limiting the required amount of catalytic material. One or more cycles of providing carrier precursors and/or counter reactants may be required before the carrier material is formed. The carrier material is typically non-catalytic and/or chemically inert under the circumstances used in the electrochemical cell.

After the carrier material is formed, the catalyst precursor may be provided. The catalyst precursor preferably reacts selectively with the carrier material. Therefore, it may be favorable if the catalyst precursor has a higher affinity for or reactivity with the carrier material than for or with the substrate.

In addition to the provision of the catalyst and optional carrier precursors, the method may further comprise one or more treatment steps. The substrate may for instance be subjected to a pre-treatment step before providing the carrier precursor to stimulate nanoparticle growth instead of layer-by-layer growth. Alternatively or additionally, the carrier material that is deposited on the substrate may be treated before providing the catalyst precursor to increase the selectivity and/or reactivity between the catalyst precursor and the carrier material. Although several treatment methods are possible, plasma exposure is particularly suitable for ALD. This plasma is typically a plasma comprising e.g. O-radicals or OH-radicals to enhance reactivity with the carrier and/or catalyst precursor or e.g. H-radicals or $CF_4$ to reduce the precursor reactivity.

Adsorption of the reactants typically occurs before the reactants react with the substrate or the layer which is deposited in an earlier cycle. Generally, this is valid for all reactants. When an excess of the first precursor is provided, usually all available and reactive groups of the substrate will react. In case a deficient amount of a precursor is provided not all of the reactive groups of the substrate or the earlier deposited layer may have reacted. A further reactant (e.g. a carrier or catalyst precursor) may thus react with the unreacted groups of the substrate or the earlier deposited layer. To ensure that in further cycles the reactant reacts with the deposit, it may be preferred to provide an excess of the precursor in each cycle in order to react all available reactive groups on the surface or the earlier deposited layer.

Advantageously, the method according to the present invention can be carried out with a single ALD apparatus, whereas conventional methods such as casting generally require a plurality of different apparatuses for the different processing steps.

In the method according to the present invention, several aspects for the ALD may be varied, including temperature, concentration of the various reactants and duration of the provision of the reactants. These aspects may be tuned in order to provide the optimal amount of the reactants for optimal coverage of the substrate and sufficient concentration of the catalytic and/or carrier material. It may be possible that an excess of a subsequent reactant is provided and thus not all of the subsequent reactant reacts with the deposit. Additionally, it may be preferred to not completely cover the substrate with the catalyst.

Advantageously, for a porous substrate, providing the reactants in the gaseous state allows diffusion of the reactants into the substrate. As such, material may be deposited within the substrate. Since the precursors are typically larger than the counter reactants, the porosity of the substrate is preferably such that the pores are large enough for the precursors to position into. Nevertheless, the penetration depth should not be too large to compromise good contact between the catalyst, the membrane and the electrode.

The contact between the catalyst, the membrane and the electrode can be achieved without requiring the pressure that is conventionally required for casting methods.

Conventionally, ALD typically provides a homogenous monolayer, equally distributed over a substrate. However, in some embodiments of the present invention, it is preferred to have a heterogeneous distribution or separate particles. This is particularly the case if the substrate is the membrane, as it accordingly allows for optimal catalytic activity as an increased surface area of the catalytic material is available while maintaining the proton transfer properties of the membrane (which is also a property defined by the membrane's surface). The heterogeneous distribution or separate particles can, for instance, be obtained by limiting the availability of the first precursor in the first cycle. However, the second reactant may then still undesirably react with the unreacted groups of the surface. This can be prevented or limited by protecting or blocking the reactive groups of the substrate or by choosing the substrate and/or second reactants such that the reactivity between the substrate towards the reactants or at least to the precursors is limited or even absent. Limited to no reactivity typically only allows defects of the substrate to react with the reactants. Defects of the substrate may expose more reactive groups or expose them differently than intact parts of the substrate do.

The substrate that is prepared according to the present invention can be distinguished from conventional casting by its morphology. Conventionally casted layers usually comprise additional materials (e.g. membrane material or ionomers) other than the catalyst that were present in the casting mixture (e.g. the slurry). In contrast to ALD, the provision of catalytic material by casting is not gaseous and thus typically no material is diffused into the substrate. For instance, under an electron microscope it may become evident that the catalyst that is deposited via casting results in a hybrid layer with an approximate thickness of 5-20 μm comprising catalyst and additional material. Therefore the contact of the catalyst with the membrane and electrode is limited. In contrast, the catalytic material provided on a substrate according to the method of the present invention is typically situated on the top surface of the substrate and may allow for good contact of the catalyst with the membrane and electrode.

The substrate is preferably a proton-exchange membrane (2). Suitable substrates preferably comprise a polymer comprising one or more groups selected from the group consisting of: $SO_3$—, COO—, $PO_3$—, $HPO_3$—, salts thereof and acids thereof. The polymer is more preferably a sulfonated fluoropolymer such as sulfonated polytetrafluoroethylene (PTFE, commercially available as Nafion™). Fluoropolymers typically have a high chemical resistance to e.g. solvents, acids and bases. Without wishing to be bound by theory, the inventors believe that only defects of the membrane will react with the reactants (or at least with the precursors) and that this enables the aforementioned heterogeneous distribution of the precursors in the substrate. Moreover, it may advantageously allow the catalyst to be formed as nanoparticles. The sulfonate group of the sulfonated PTFE provides the membrane with ionic properties. The protons on the sulfonate groups may translocate from one sulfonate group to another, thereby thus being conducted through the membrane. The substrate is usually electronically insulating as there is typically no path for electrons to move.

In another embodiment, the substrate may be an electrode (3) such as a porous electrode, preferably an electrode comprising titanium. By providing an electrode with the catalytic material, good contact of the catalyst, the membrane and the electrode may also be provided.

An example of an electrochemical cell (1) comprising a membrane (2) and two electrodes (3) is illustrated in FIG. 1. Herein the substrate is a porous electrode (3) that is provided with catalytic material in the form of nanoparticles (4) according to the present invention. The membrane and electrodes may suitably be used in PEM fuel cells or other electrolysis cells. In PEM water electrolysis cells, water is split into protons, electrons and oxygen when in contact with the catalyst at the anode site. The protons can travel through the membrane, while the electrons are typically forced into an external circuit. Electrons can enter at the cathode site where they can combine with the protons to produce hydrogen. In addition to the catalytic material, the anode may further comprise an inert metal, wherein inert means that the metal does not undergo a reaction at the conditions that are typically used during the chemical process and during the method according to the present invention. Suitable metals on which anode is based generally include titanium. Titanium may for instance be the main metal constituent to form the anode or may be used to form a coating on e.g. stainless steel. The cathode for PEM electrolysis cells may for instance comprise carbon paper or carbon fleece. In case the electrolysis cell is employed as a PEM fuel cell, the cathode and anode are switched, and water is formed from hydrogen and oxygen. Accordingly, the substrate may also be a cathode.

It is typically advantageous to have a maximum surface area of the catalyst available to participate in the reaction. An increased surface area may be obtained by using nanoparticles. Therefore the ALD comprises depositing nanoparticles comprising the catalytic material and the carrier material. The nanoparticles are preferably between 1 to 50 nm, more preferably between 1 to 30 nm, most preferably between 2 to 20 nm in size. The nanoparticles comprise core-shell nanoparticles comprising a core comprising the carrier material and a shell comprising the catalytic material. Core-shell nanoparticles typically reduce the amount of catalyst needed, especially in combination with ALD. As such, the costs of the catalyst may be reduced. The core of a core-shell nanoparticle may thus for instance comprise a cheaper material. The core-shell nanoparticles typically still enable access to a maximum surface area, which relates to optimal catalytic performance.

The core-shell nanoparticles may have a variety of morphologies including an ideal core-shell wherein the core is fully and homogenously surrounded by the shell and a dumbbell-like morphology where the core is partially surrounded by the shell. The core-shell nanoparticles are preferably formed in-situ by first depositing the core by a cycle of the carrier precursor (or multiple carrier precursors) and the counter reactant followed by depositing the shell by a cycle of the catalyst precursor (or multiple catalyst precursors) and the counter reactant. It may be required to perform several cycles for the formation of the carrier material before providing the catalyst precursor. Additionally, it may be required to provide multiple cycles for the formation of the catalytic material before a sufficient core-shell nanoparticle is obtained.

Typically, the carrier material may be formed such that it is at least partially within the substrate, or in other words, at least partially buried or penetrated in the substrate. The catalytic material may then be substantially area-selectively deposited on only the carrier material, due to the difference in reactivity between the catalytic precursor with the carrier material and the substrate. This generally provides a unique combination of an at least partially buried core of the core-shell nanoparticle and area-selective deposition of the shell on the core.

Typically, it is required for the catalyst precursor to react with the carrier material instead of with the substrate. Therefore, preferably the reactivity of the catalyst precursor with the carrier material is higher than the reactivity of the catalyst precursor with the substrate.

The precursors are typically chosen on their volatility and thermal stability. Additionally, it is preferred that the precursors are soluble in an inert solvent or are liquid at room temperature for easier storage and usability. Thermal stability is typically required as this prevents the precursors from decomposing during vaporization. Precursors may for instance include metal hydrides, metal halides, but also metal organic compounds such as metal diketonates, metal alkoxides, metal alkyls, metal amidinates and metal carbonyls. Furthermore, it is typically required that the precursors have functional groups with a preferred reactivity towards the deposit. In addition, the precursors are preferably self-limiting after reacting with the substrate or deposit. Additionally, the counter reactants are also typically self-limiting when reacted with the deposit.

For PEM electrolysis cells, the catalyst used on the anode site is typically iridium oxide ($IrO_2$) and the catalyst on the cathode site typically platinum. The catalyst may be provided by providing the catalyst precursor on the PEM membrane and/or on the electrode. After formation of the catalyst on the substrate, the catalyst is sandwiched between the membrane and electrode.

The catalyst on the anode site of a PEM electrolysis cell typically comprise a metal oxide such as iridium oxide ($IrO_2$) or ruthenium oxide ($RuO_2$). It is accordingly preferred that the catalyst precursor is based on a corresponding metal ion and thus typically comprises an organometallic complex comprising said metal ion. Suitable catalyst precursors are accordingly selected from the group consisting of bis(cyclopentadienyl)ruthenium ($RuCp_2$), ruthenium (VIII)oxide ($RuO_4$), (2,4-dimethyloxopentadienyl)(ethylcyclopentadienyl)ruthenium (Ru(CpEt)(dmopd)), bis(ethylcyclopentadienyl)ruthenium ($Ru(CpEt)_2$), $\eta^4$-2,3-dimethylbutadiene ruthenium tricarbonyl (Ru(DMBD) $(CO)_3$), (1,5-hexadiene)(1-isopropyl-4-methylbenzene)ruthenium (Ru(hd)(ipmp)), ruthenium cyclooctadiene bis(2,2, 6,6-tetramethyl-3,5-heptanedionate) ($Ru(thd)_2(cod)$), (ethylcyclopentadienyl)(cyclohexadiene)iridium (EtCpIr (CHD)), (ethyl cyclopentadienyl)(1,5-cyclooctodiene) iridium (EtCpIr(COD)) and iridiumacetylacetonate ($Ir(acac)_3$).

Preferably, the catalyst comprises iridium oxide ($IrO_2$) and the catalyst precursor is therefore preferably selected from the group consisting of: (ethylcyclopentadienyl)(cyclohexadiene)iridium (EtCpIr(CHD)), (ethyl cyclopentadienyl)(1,5-cyclooctodiene) iridium (EtCpIr(COD)) and iridium acetylacetonate ($Ir(acac)_3$).

As described herein-above, in order to form the catalyst the counter reactant is typically required. This counter reactant is typically an oxygen-containing source such as a molecular oxygen fluid, ozone, a plasma comprising oxygen-containing radicals (e.g. $O_2$, $H_2O$, $N_2O$ as oxygen source) or water. Alternatively, depending on the precursor, a reduction agent may be required. Suitable counter reactants would accordingly typically be a hydrogen-containing source such as a plasma comprising hydrogen-radicals. After the provision of the counter reactant, the catalyst, such as iridium oxide, can be formed from the catalyst precursor. The iridium oxide can then function as the catalyst at the anode site in a PEM electrolysis cell.

For the cathode site, it may be preferred that the catalyst comprises a metal, preferably platinum. Therefore, typically at least one of the catalyst precursors comprises a metal, preferably on a transition metal, more preferably on platinum, most preferably the catalyst precursor is selected from the group consisting of platinum acetylacetonate ($Pt(acac)_2$) and (methyl cyclopentadienyl)(methyl) platinum (Pt(CpMe) $Me_3$). Again, the counter reactant is typically required in the form of e.g. oxygen, ozone, plasma comprising oxygen-containing radicals or hydrogen-radicals or water before a functional catalyst is obtained.

It may be preferred that the carrier material comprises a metal oxide such as titanium oxide ($TiO_2$), aluminum oxide ($Al_2O_3$) or zinc oxide (ZnO), preferably titanium oxide. It is therefore typically preferred that the carrier precursor comprises a corresponding metal ion, preferably the carrier precursor comprises a titanium, aluminum or zinc ion, more preferably the carrier precursor is selected from the group consisting of trimethyl aluminum ($AlMe_3)_2$, diethyl zinc ($C_2H_5)_2Zn$, titanium chloride ($TiCl_4$), titanium isopropoxide (TTIP) and tetrakis(dimethylamido)titanium (TDMAT). It is most preferred that the carrier precursor is selected from the group consisting of titanium chloride ($TiCl_4$), titanium isopropoxide (TTIP) and tetrakis(dimethylamido)titanium (TDMAT). The metal oxide is typically obtained by first providing a carrier precursor comprising the metal followed by the provision of the counter reactant.

Figure 2:
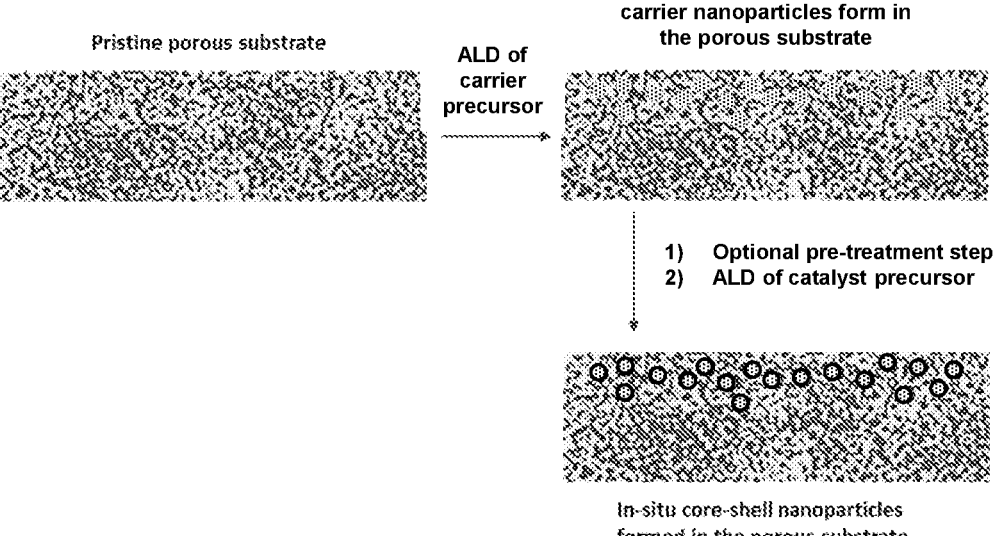
FIG. 2 illustrates a reaction scheme for a preferred embodiment according to the present invention.

A preferred embodiment of the present invention is based on core-shell nanoparticles comprising titanium oxide as core and iridium oxide as shell. A suitable reaction scheme is illustrated in FIG. 2. The nanoparticles may for instance be formed by first depositing titanium oxide on the PTFE based membrane by using $TiCl_4$, TTIP or TDMAT as the carrier precursor, followed by the counter reactant. Optimization of the parameters such as number of cycles, reactant dose and duration may result in the formation of titanium oxide nanoparticles (see e.g. DeStefano et al. *ACS Omega,* 3, 2018, 10493-10502). After the titanium oxide nanoparticles are formed on the substrate, iridium oxide may be deposited in one or more cycles. The deposition of iridium oxide is typically achieved by using EtCpIr(CHD), $Ir(acac)_3$ or EtCpIr(COD) as the catalyst precursor, followed by the counter reactant.

Without wishing to be bound by theory, the inventors believe that when the counter reactant for the formation of the core is water, the core will have hydroxyl terminated groups available at its surface. The catalyst precursor generally has a preference for binding to the hydroxyl groups via ligand exchange. Thereby thus typically minimizing the reaction of the catalyst precursor with the membrane. After the provision of the counter reactant, the remaining ligands may be flushed away resulting in core-shell nanoparticles on the membrane.

The method comprises ALD and as described above ALD is typically performed by providing subsequent precursors while the precursors are physically kept separated by intermediate purge steps. A specific type of ALD is temporal ALD, wherein deposition cycles are separated in time. However, a preferred type of ALD is spatial ALD. Spatial ALD is a type of ALD wherein the subsequent precursors are continuously supplied but kept physically separated by an inert gas region (see e.g. Munoz-Rojas et al., Spatial Atomic Layer Deposition, Chemical Vapor Deposition for Nanotechnology, 2019). The substrate is typically moved towards the separated precursors in order for the deposit to grow. Spatial ALD may be beneficial as the intermediate purging step can be eliminated. The growth of the deposit or the particles typically follows the same path as for temporal ALD.

Further aspects of the present invention are directed to a substrate and to a PEM electrolysis cell comprising said substrate provided with a catalytic material.

Preferably the substrate of the PEM electrolysis cell comprises nanoparticles, preferably core-shell nanoparticles that comprise a core comprising the carrier material and a shell comprising the catalytic material as described herein-above.

The invention claimed is:

1. A method for providing a substrate for an electrochemical cell with a catalytic material wherein said method comprises atomic layer deposition (ALD) comprising depositing nanoparticles on a substrate, wherein the nanoparticles comprise core-shell nanoparticles that comprise a core comprising a carrier material and a shell comprising the catalytic material, and wherein said ALD comprises:

providing a gaseous carrier precursor and allowing said carrier precursor to react with the substrate, followed by providing a second gaseous counter reactant and allowing said second gaseous counter reactant to react with the carrier precursor forming the carrier material, followed by providing a gaseous catalyst precursor for the catalytic material and selectively reacting the catalyst precursor with the carrier material, followed by providing a first gaseous counter reactant and allowing said first gaseous counter reactant to react with said catalyst precursor forming said catalytic material.

2. The method according to claim 1, wherein the substrate is a proton-exchange membrane or wherein the substrate is an electrode.

3. The method according to claim 1, wherein said nanoparticles are between 1 to 50 nm.

4. The method according to claim 1, wherein the carrier material is formed at least partially within the substrate and/or wherein the catalytic precursor is area-selectively deposited on the carrier material.

5. The method according to claim 1, wherein the catalyst precursor comprises a metal ion.

6. The method according to claim 1, wherein the carrier precursor comprises a metal ion.

7. The method according to claim 1, wherein said catalytic material comprises iridium oxide ($IrO_2$), ruthenium oxide ($RuO_2$) or platinum (Pt), and wherein said carrier material comprises titanium oxide ($TiO_2$), zinc oxide (ZnO) or aluminum oxide ($Al_2O_3$).

8. The method according to claim 1 wherein ALD is spatial ALD.

9. A substrate provided with a catalytic material that is obtainable according to claim 1, wherein the substrate comprises core-shell nanoparticles that comprise a core comprising said carrier material and a shell comprising said catalytic material.

10. The substrate according to claim 9, wherein said substrate comprises the core-shell nanoparticles that comprise a core comprising titanium and a shell comprising iridium.

11. A PEM electrolysis cell comprising a substrate according to claim 9.

12. The method according to claim 1, wherein the substrate is a proton- exchange membrane comprising a polymer comprising one or more groups selected from the group consisting of: $SO_3^-$, $COO^-$, $PO_3^-$, $HPO_3^-$, salts thereof and acids thereof or wherein the substrate is an electrode which comprises titanium.

13. The method according to claim 1, wherein said catalytic material comprises iridium oxide ($IrO_2$) and wherein said carrier material comprises titanium oxide ($TiO_2$).

14. The method according to claim 1, wherein the catalyst precursor comprises an iridium, ruthenium or platinum ion.

15. The method according to claim 2, wherein the catalyst precursor is selected from the group consisting of bis (cyclopentadienyl)ruthenium ($RuCp_2$), ruthenium(VIII)oxide ($RuO_4$), (2,4-dimethyloxopentadienyl)(ethylcyclopentadienyl)ruthenium (Ru(CpEt)(dmopd)), bis (ethylcyclopentadienyl)ruthenium ($Ru(CpEt)_2$), $\eta^4$-2,3-dimethylbutadiene ruthenium tricarbonyl (Ru(DMBD) $(CO)_3$), Ru(hd)(ipmp), ruthenium cyclooctadiene bis(2,2,6, 6-tetramethyl-3,5-heptanedionate) ($Ru(thd)_2(cod)$), (ethyl-cyclopentadienyl)(cyclohexadiene)iridium (EtCplr(CHD)), (ethyl cyclopentadienyl)(1,5-cyclooctodiene) iridium (EtCpIr(COD)), iridium acetylacetonate ($Ir(acac)_3$), platinum acetylacetonate ($Pt(acac)_2$) and (methyl cyclopentadienyl)(methyl) platinum ($Pt(CpMe)Me_3$).

16. The method according to claim 1, wherein the carrier precursor is selected from the group consisting of trimethyl aluminum ($AlMe_3)_2$, diethyl zinc ($C_2H_5)_2Zn$, titanium chloride ($TiCl_4$), titanium isopropoxide (TTIP) and tetrakis(dimethylamido)titanium (TDMAT).

* * * * *